US008558468B2

(12) United States Patent
Harada et al.

(10) Patent No.: US 8,558,468 B2
(45) Date of Patent: Oct. 15, 2013

(54) WHITE LED LIGHT SOURCE MODULE (75) Inventors: Mitsunori Harada, Tokyo (JP);
Masanori Sato, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 391 days.

(21) Appl. No.: 13/049,879

(22) Filed: Mar. 16, 2011

(65) Prior Publication Data
US 2011/0227486 A1  Sep. 22, 2011

(30) Foreign Application Priority Data

Mar. 16, 2010  (JP) ................... 2010-059449

(51) Int. Cl.
*H05B 37/02* (2006.01)
(52) U.S. Cl.
USPC .......................................... 315/158; 315/291
(58) Field of Classification Search
USPC .................. 315/149–158, 291, 302, 307; 313/493–501
See application file for complete search history.

(56) References Cited

U.S. PATENT DOCUMENTS 7,859,193 B2     12/2010  Fukasawa
7,906,904 B2 *    3/2011  Kawae et al. ................. 313/512
8,044,572 B2 *   10/2011  Sakata et al. ................. 313/503

FOREIGN PATENT DOCUMENTS

JP         2006-251396 A     9/2006

* cited by examiner

*Primary Examiner* — Jimmy Vu
(74) *Attorney, Agent, or Firm* — Kenealy Vaidya LLP (57) ABSTRACT A white LED light source module can have a white LED light source that includes a blue LED element and a fluorescent material in combination, and a member that can prevent the color of the fluorescent material itself from being directly observed when the light source module does not function as a light source. The white LED light source module can have a photosensor to detect external light. In a standby mode of the white LED light source module, the blue LED element can be supplied with a small driving current corresponding to the brightness of the external light detected by the photosensor, so that the white LED light source can be lit with the luminance substantially equal to the external light.

24 Claims, 9 Drawing Sheets

Fig. 12B ered yellowish while the sealing resin
WHITE LED LIGHT SOURCE MODULE

This application claims the priority benefit under 35 U.S.C.§119 of Japanese Patent Application No. 2010-059449 filed on Mar. 16, 2010, which is hereby incorporated in its entirety by reference.

TECHNICAL FIELD

The presently disclosed subject matter relates to a white LED light source module having a white LED light source that is configured to include a blue LED element and a fluorescent material in combination. In particular, the presently disclosed subject matter relates to a white LED light source module that can prevent the color of the fluorescent material itself from being directly observed when the light source module does not function as a light source. Herein, the light source module can be used as an illumination light source or a display device light source, for example.

BACKGROUND ART

When an LED light source serves as a white light source utilizing an LED device and a fluorescent material in combination, for example, a blue LED element that can emit blue light can be resin sealed with a sealing resin. In this case, the sealing resin can include a base transparent resin and a yellow fluorescent material dispersed in the transparent resin. The yellow fluorescent material can be excited by blue light, thereby being capable of wavelength-converting the light to emit yellow light which has a complementary color to blue. When the above configured LED light source is turned on, the blue LED element can emit blue light. Part of the blue light from the blue LED element can excite the yellow fluorescent material so that the yellow fluorescent material can wavelength convert the blue light to yellow light. Then, the remaining part of the blue light can be mixed with the yellow light from the yellow fluorescent material to generate pseudo white light by means of additive color mixing.

Alternatively, instead of the yellow fluorescent material, a green fluorescent material and a red fluorescent material can be used to be dispersed in the transparent resin for resin sealing the LED light source. The green fluorescent material can be excited by blue light, thereby being capable of wavelength-converting the light to emit green light. The red fluorescent material can be excited by blue light, thereby being capable of wavelength-converting the light to emit red light. When the above configured LED light source is turned on, the blue LED element can emit blue light. Part of the blue light from the blue LED element can excite the green fluorescent material so that the green fluorescent material can wavelength convert the blue light to green light. Another part of the blue light from the blue LED element can excite the red fluorescent material so that the red fluorescent material can wavelength convert the blue light to red light. Then, the remaining part of the blue light can be mixed with the green light and the red light from the respective fluorescent materials to generate pseudo white light by means of additive color mixing.

In either case, the fluorescent material can emit faint light at a certain intensity even when the LED element is turned off. This is because the fluorescent material can be excited by any light of a wavelength range from ultraviolet to blue, which may be contained in outside light including natural light such as sunlight and artificial light such as light from an incandescent lamp, a fluorescent lamp, and the like. Accordingly, when the sealing resin sealing the LED element is observed while the LED element is turned off, the sealing resin containing the yellow fluorescent material dispersed therein may be observed as a yellowish member while the sealing resin containing the red and green fluorescent materials dispersed therein may be observed as an orangish member.

In particular, when the white LED light source with the above configuration is used together with optical devices such as a reflector, a lens, and the like, the sealing resin may be enlarged by the optical devices, thereby being remarkably conspicuous with the fluorescent material color while being turned off. This may degrade the appearance of the overall optical system.

In order to cope with this type of problem, a white light diffusion layer may be provided over the surface of the sealing resin, or a white light diffusion member may be disposed in front of the sealing resin. In this way, the outside light such as natural light or artificial light can be shielded by the layer or member to suppress the excitation of the fluorescent material, thereby improving the outer appearance of the overall optical system.

However, the above configuration has the problem in which the light emitted from the LED element may be diffused or absorbed by the white light diffusion layer or member provided in front of the device, which can result in light loss and a decrease in the entire light intensity or axial direction luminous intensity. Furthermore, such a white light diffusion layer or member may have optical characteristics such that it can easily absorb visible light at a shorter wavelength range. Accordingly, in the above configuration, the light emitted from the light source device may be shifted in wavelength by the white light diffusion layer or member.

In view of these problems, an illumination apparatus has been proposed in, for example, Japanese Patent Application Laid-Open No. 2006-251396 (corresponding to U.S. Pat. No. 7,859,193B2) to prevent the fluorescent material color from being observed from outside. The illumination apparatus can be configured to provide a standby current flow through an LED chip when the system does not function as a light source so that the LED chip can emit faint light to excite a fluorescent material to some extent. This excitation can generate faint light from the fluorescent light mixed together with the original faint light. Accordingly, the mixed light can generate faint white light to hinder the fluorescent material color itself.

In the above proposed illumination apparatus, a standby current that is to flow through the LED chip can be controlled according to a driving signal based on the brightness of external light detected by an external light sensor, thereby reducing the power consumption. However, the technique does not clearly show the configuration and functions relating to the LED light source, the external light sensor, and their positional relationship and the like as well as the relationship between the brightness of the LED light source and that of the external light. This may make concrete modes achieved by this technique difficult to conceptualize.

SUMMARY

The presently disclosed subject matter was devised in view of these and other problems and features and in association with the conventional art. According to an aspect of the presently disclosed subject matter, a white LED light source module can have a white LED light source that is configured to include a blue LED element and a fluorescent material in combination, and a member that can prevent the color of the fluorescent material itself from being directly observed when the light source module does not function as a light source.

According to another aspect of the presently disclosed subject matter, a white LED light source module can be configured to include a white LED light source having an illumination direction and a first photosensor having a light receiving direction and configured to detect brightness of external light and generate a first detection signal. The white LED light source can be configured to include an LED element configured to emit light and a sealing resin containing a transparent resin and a fluorescent material dispersed in the transparent resin, the sealing resin being capable of sealing the entire LED element. The LED light module can further include a lighting chamber defined by a mounting base portion on which the white LED light source and the first photosensor can be disposed, a side wall disposed on and erected from the mounting base portion and having an upper opening, and a transparent cover to cover the opening of the side wall. In the lighting chamber, the white LED light source and the first photosensor can be disposed side by side such that the illumination direction of the white LED light source is almost the same direction as the light receiving direction of the first photosensor. The LED light source module can further include an LED driving current controlling unit configured to control an LED driving current to be flown through the LED element. When the white LED light source module does not function as a light source and is in a standby state, the first photosensor can detect the brightness of external light to generate and send the first detection signal to the LED driving current controlling unit, and according to the received first detection signal the LED driving current controlling unit can generate and send a controlled current to drive the LED element so that brightness of the white LED light source can be almost the same as that of the external light.

According to another aspect of the presently disclosed subject matter, the white LED light source module with the above described configuration can be configured to further include a second photosensor that is disposed near the transparent cover and is configured to have a light receiving surface facing to the white LED light source to detect brightness of the white LED light source and generate a second detection signal, and a signal comparing unit configured to compare the first detection signal from the first photosensor that can detect the brightness of external light and the second detection signal from the second photosensor that can detect the brightness of the white LED light source to send a comparison result to the LED driving current controlling unit. The LED driving current controlling unit can control the current for driving the LED element so that the comparison result becomes zero (namely, the brightness of the white LED light source is almost equal to that of the external light).

According to still another aspect of the presently disclosed subject matter, in the white LED light source module with any of the above described configurations, the first photosensor and the second photosensor each can include a photodiode.

According to still further another aspect of the presently disclosed subject matter, the white LED light source module with any of the above described configurations can be configured to further include a shielding wall disposed on the mounting base portion and can have a reflecting surface. The transparent cover can cover the end of the shielding wall and the shielding wall and the side wall can define spaces accommodating the first photosensor and the white LED light source, respectively.

According to still further another aspect of the presently disclosed subject matter, the white LED light source module with any of the above described configurations can be configured to further include a seating member disposed on the mounting base portion and configured to receive the first photosensor thereon so that a light emission surface of the white LED light source is flush with the first photosensor on top of the seating member.

According to still another aspect of the presently disclosed subject matter, a white LED light source module can be configured to include a white LED light source and a transparent thin film solar panel. The white LED light source can be configured to include an LED element configured to emit light and a sealing resin containing a transparent resin and a fluorescent material dispersed in the transparent resin, the sealing resin being capable of sealing the entire LED element. The LED light module can further include a lighting chamber defined by a mounting base portion on which the white LED light source can be disposed, a side wall disposed on and erected from the mounting base portion and having an upper opening, and a transparent cover to cover the opening of the side wall. The transparent thin film solar panel can be disposed near the transparent cover. When the white LED light source module does not function as a light source and is in a standby state, the transparent thin film solar panel can receive external light to generate a driving current for the LED element so that brightness of the white LED light source can be almost the same as that of the external light.

According to a still further aspect of the presently disclosed subject matter, in the white LED light source module with any of the above described configurations, the LED element can be a blue LED element that can emit blue light, and the fluorescent material can be any of a yellow fluorescent material that can be excited by blue light to emit yellow light and a fluorescent material mixture of a green fluorescent material that can be excited by blue light to emit green light and a red fluorescent material that can be excited by blue light to emit red light.

The white LED light source module with any of the above configurations can be configured to include the white LED light source including an LED element and a sealing resin including a transparent resin and a fluorescent material dispersed in the transparent resin for sealing the LED light source, and the photosensor configured to detect the external light. In the standby mode of the white LED light source module, the LED element can be supplied with a small driving current corresponding to the brightness of the external light detected by the photosensor, so that the white LED light source can be lit with the luminance almost equal to the external light.

As a result, the fluorescent material color in the sealing resin can be concealed while the faint lighting state of the white LED light source can be controlled to be inconspicuous. Accordingly, this configuration can improve the appearance of apparatus, equipment, and the like that are provided with this white LED light source module thereby improving the quality and the merchandizability.

BRIEF DESCRIPTION OF DRAWINGS

These and other characteristics, features, and advantages of the presently disclosed subject matter will become clear from the following description with reference to the accompanying drawings, wherein.

DESCRIPTION OF EXEMPLARY EMBODIMENTS

A description will now be made below with respect to examples of white LED light source modules of the presently disclosed subject matter with reference to the accompanying drawings in accordance with exemplary embodiments.

Specifically, several exemplary embodiments will be described with reference to FIGS. 1A to 12B, wherein the same or similar components will be denoted by the same reference numerals. It should be noted that the following exemplary embodiments are described with various concrete features for illustrating the concrete examples, but the presently disclosed subject matter should not be limited to these features.

A white LED light source module made in accordance with the principles of the presently disclosed subject matter can be configured to include a white LED light source and a photosensor configured to detect external light, the white LED light source being configured to include a blue LED element and a sealing resin including a transparent resin and a fluorescent material dispersed in the transparent resin and sealing the blue LED element. When the white LED light source module does not function as a light source and is in a standby state, the photosensor can detect the brightness of the external light and the blue LED element can be driven with a small driving current corresponding to the brightness of the external light. In this way, the color intrinsic to the fluorescent material in the sealing resin can be concealed while the faint lighting state of the white LED light source can be controlled to be inconspicuous. Accordingly, this configuration can improve the appearance of apparatus, equipment, and the like that are provided with this white LED light source module thereby improving the quality and the merchandizability.

[First Exemplary Embodiment]

Figure 1A:
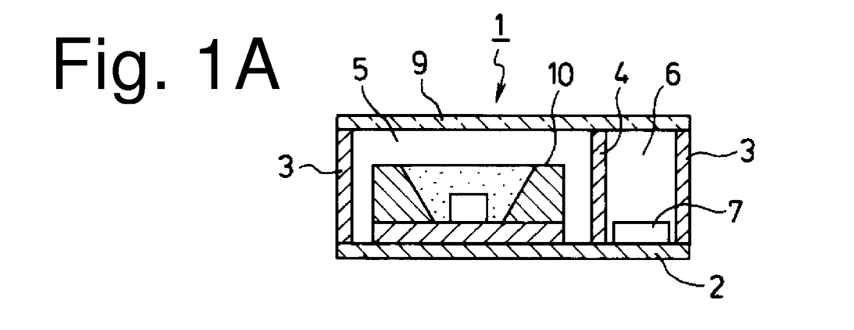
FIG. 1A is a cross sectional view illustrating a first exemplary embodiment of a white LED light source module made in accordance with principles of the presently disclosed subject matter.
Figure 1B:
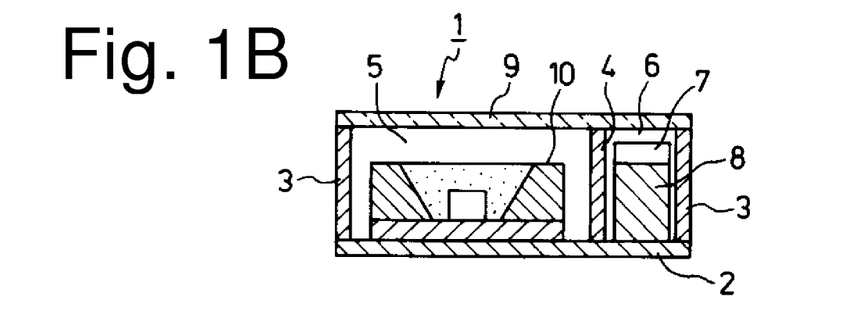
FIG. 1B is a cross sectional view illustrating one modified example of the present exemplary embodiment of the white LED light source module.
Figure 1C:
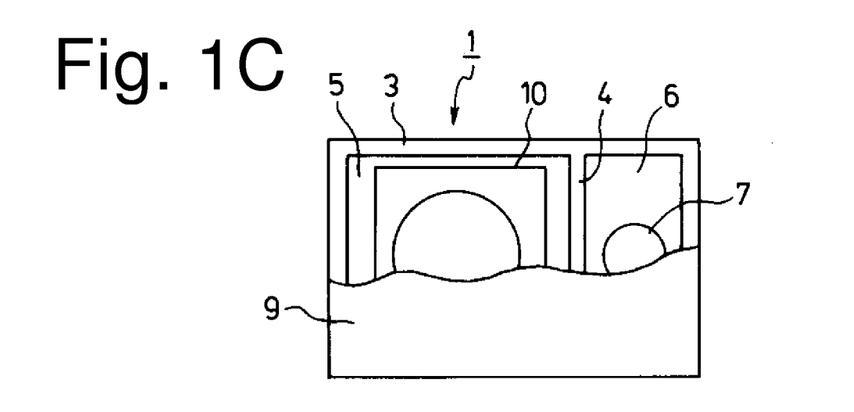
FIG. 1C is a partially cut top view of the white LED light source module of FIG. 1A or 1B.

According to the first exemplary embodiment, the white LED light source module can include a single white LED light source and a single photosensor. FIG. 1A is a cross sectional view illustrating the first exemplary embodiment of the white LED light source module 1 made in accordance with the principles of the presently disclosed subject matter, FIG. 1B is a cross sectional view illustrating one modified example of the present exemplary embodiment of the white LED light source module 1, and FIG. 1C is a partially cut top view of the white LED light source module 1 of FIG. 1A or 1B. As shown in the drawings, the white LED light source module 1 can include the white LED light source 10 and the photosensor 7, and further a shielding wall 4 between them.

First with reference to FIG. 2, the white LED light source 10 for use in the white LED light source module 1 of any of the present and following exemplary embodiments will be described.

Figure 2:
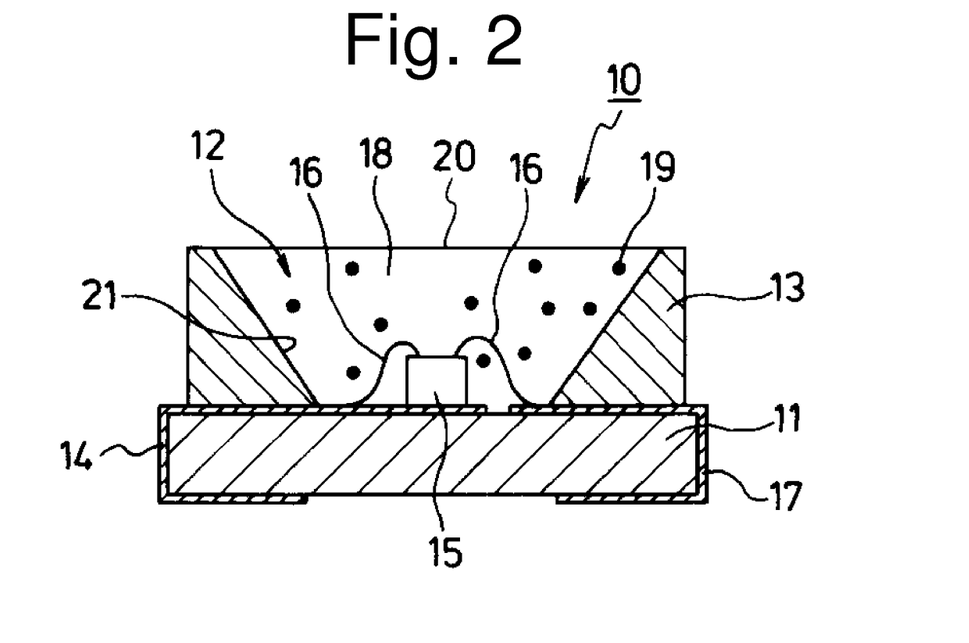
FIG. 2 is a cross sectional view of an LED light source utilized in the white LED light source module.

The white LED light source 10 as shown in FIG. 2 may be of a so-called surface mount type and can be configured to include a substrate 11 having a circuit pattern formed thereon, a reflecting frame 13 having a mortar-shaped concave portion 12 with an upward opening, and an InGaN type blue LED element 15 configured to emit blue light and disposed on a first circuit pattern 14 exposed on the bottom of the concave portion 12 with an adhesive member (not shown) interposed therebetween. The blue LED element 15 can have two electrodes formed on the top thereof (not shown) that are electrically connected to the first circuit pattern 14 and a second circuit pattern 17 provided separately from the first circuit pattern 14 via respective bonding wires 16.

The concave portion 12 of the reflecting frame 13 can be filled with a sealing resin 20 so that the sealing resin seals the blue LED element 15 and the bonding wires 16. Herein, the sealing resin 20 can be composed of a transparent resin 18 and a fluorescent material 19 mixed and dispersed in the transparent resin. It should be noted that the reflecting frame 13 can be formed from a high reflectance member with a high shielding effect while the inside surface 21 of the concave portion 12 may or may not be subjected to a special reflection treatment such as sputtering, coating, or the like processing of aluminum, silver or the like so as to be formed into a reflecting surface.

The fluorescent material 19 can be any of a yellow fluorescent material that can be excited by blue light emitted from the blue LED element 15 to wavelength convert the light and emit the resulting yellow light that has a complementary color to blue, and a fluorescent material mixture of a green fluorescent material that can be excited by blue light emitted from the blue LED element 15 to wavelength convert the light and emit the resulting green light and a red fluorescent material that can be excited by blue light emitted from the blue LED element 15 to wavelength convert the light and emit the resulting red light.

When the fluorescent material 19 is a yellow fluorescent material and the blue LED element 15 emits blue light, part of the blue light from the blue LED element 15 can excite the yellow fluorescent material so that the yellow fluorescent material can wavelength convert the blue light to yellow light. Then, the remaining part of the blue light can be mixed with the yellow light from the yellow fluorescent material to generate pseudo white light by means of additive color mixing.

Alternatively, when the fluorescent material 19 is a fluorescent material mixture of a green fluorescent material and a red fluorescent material and the blue LED element 15 emits blue light, part of the blue light from the blue LED element 15 can excite the green fluorescent material so that the green fluorescent material can wavelength convert the blue light to green light while another part of the blue light from the blue LED element 15 can excite the red fluorescent material so that the red fluorescent material can wavelength convert the blue light to red light. Then, the remaining part of the blue light can be mixed with the green light and the red light from the respective fluorescent materials to generate pseudo white light by means of additive color mixing.

In either case, the fluorescent material 19 can emit faint light at a certain intensity even when the blue LED element 15 is turned off because the fluorescent material 19 can be excited by any light of a wavelength range from ultraviolet to blue, which may be contained in outside light including natural light such as sunlight and artificial light such as light from an incandescent lamp, a fluorescent lamp, and the like. Accordingly, when the sealing resin 20 sealing the blue LED element 15 is observed while the blue LED element 15 is turned off, the sealing resin 20 containing the yellow fluorescent material dispersed therein may be observed as a yellowish member while the sealing resin 20 containing the red and green fluorescent materials dispersed therein may be observed as an orangish member.

Figure 3:
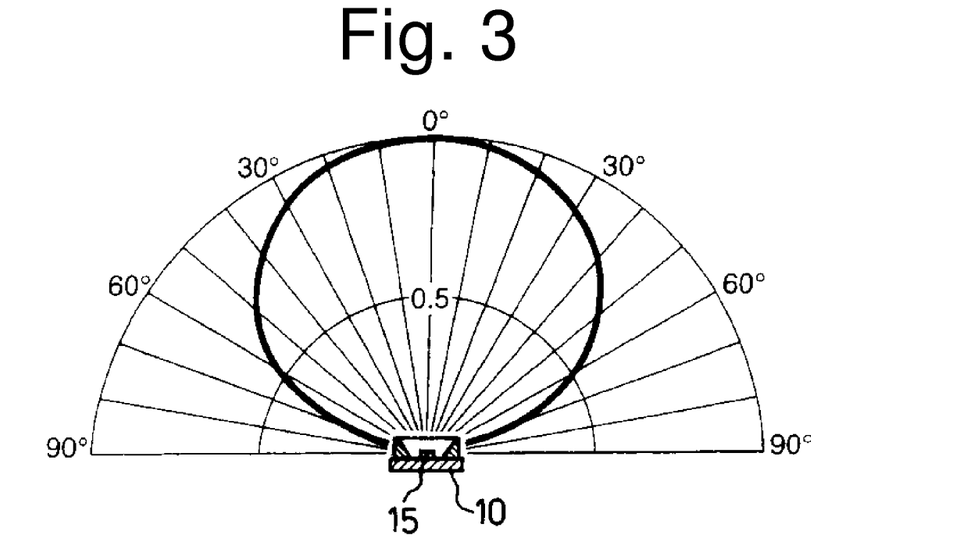
FIG. 3 is a diagram showing the light emission distribution characteristics of the LED light source of FIG. 2.

The white LED light source 10 may have light distribution characteristics with a Lambertian distribution as shown in FIG. 3, and accordingly, the intensity of light emitted from the blue LED element 15 and directed in a sideward direction of the white LED light source 10 is low.

Returning to FIG. 1, the white LED light source module 1 can include a mounting base 2 and a side wall 3 provided on and erected from the mounting base 2 with the side wall 3 being formed from a high reflectance member with a high shielding effect. The shielding wall 4 formed from a high reflectance member with a high shielding effect can be disposed inside the space surrounded and defined by the side wall 3 so as to separate the space into two spaces, a first space 5 and a second space 6. It should be noted that the side wall 3 and the shielding wall 4 may be integrally formed or may be separate members. In addition, the mounting base 2 in any of the embodiments can be planar, or can be non-planar with elevated portions or curves, etc. The mounting base 2 can also include multiple portions attached or stacked together, or can be a single continuous extruded piece of material.

In this case, the white LED light source 10 can be mounted on the mounting base 2 within the first space 5 and the photosensor 7 can be mounted on the mounting base 2 within the second space 6 (see FIG. 1A). Alternatively, the photosensor 7 can be mounted on a seating member 8 that is disposed on the mounting base 2 so that the white LED light source 10 can be flush with the photosensor 7 (see FIG. 1B). It should be noted that the photosensor 7 may be a photoelectric converter such as a photodiode, a photo transistor, and the like.

Above the white LED light source 10 and the photosensor 7, a transparent cover 9 can be disposed so as to cover them.

In both of the white LED light source module of FIG. 1A and that of FIG. 1B, the white LED light source 10 and the photosensor 7 can be accommodated in the first space 5 and the second space 6 separated by the shielding wall 4, respectively. This shielding wall 4 can prevent optical noise that may occur due to light emitted from the white LED light source 10 directly entering the photosensor 7.

In the white LED light source module 1 of FIG. 1A, the photosensor 7 is mounted on the mounting base 2 within the second space 6 which is defined by the side wall 3 made of a high reflectance member and the shielding wall 4 also made of a high reflectance member. Although the photosensor 7 is located away from the transparent cover 9, the external light can reach the light receiving surface of the photosensor 7 while being efficiently reflected by the surrounding side wall 3 and shielding wall 4.

In the white LED light source module 1 of FIG. 1B, the seating member 8 can be disposed on the mounting base 2 within the second space 6 which is defined by the side wall 3 made of a high reflectance member and the shielding wall 4 also made of a high reflectance member, and the photosensor 7 can be mounted on the seating member 8 so that the white LED light source 10 can be flush with the photosensor 7 on top of the seating member 8. Since the photosensor 7 is located near the transparent cover 9, the external light can efficiently and directly reach the light receiving surface of the photosensor 7.

In the case of the white LED light source module 1 as shown in FIG. 1A, there is no need to provide a seating member 8, thereby reducing the manufacturing costs for this member as well as man hour for assembly.

In the case of the white LED light source module 1 as shown in FIG. 1B, the direct external light can be received by the photosensor 7, thereby achieving accurate detection of external light. This means the facilitation of adjustment of the brightness of the white LED light source to that of the external light.

Figure 4:
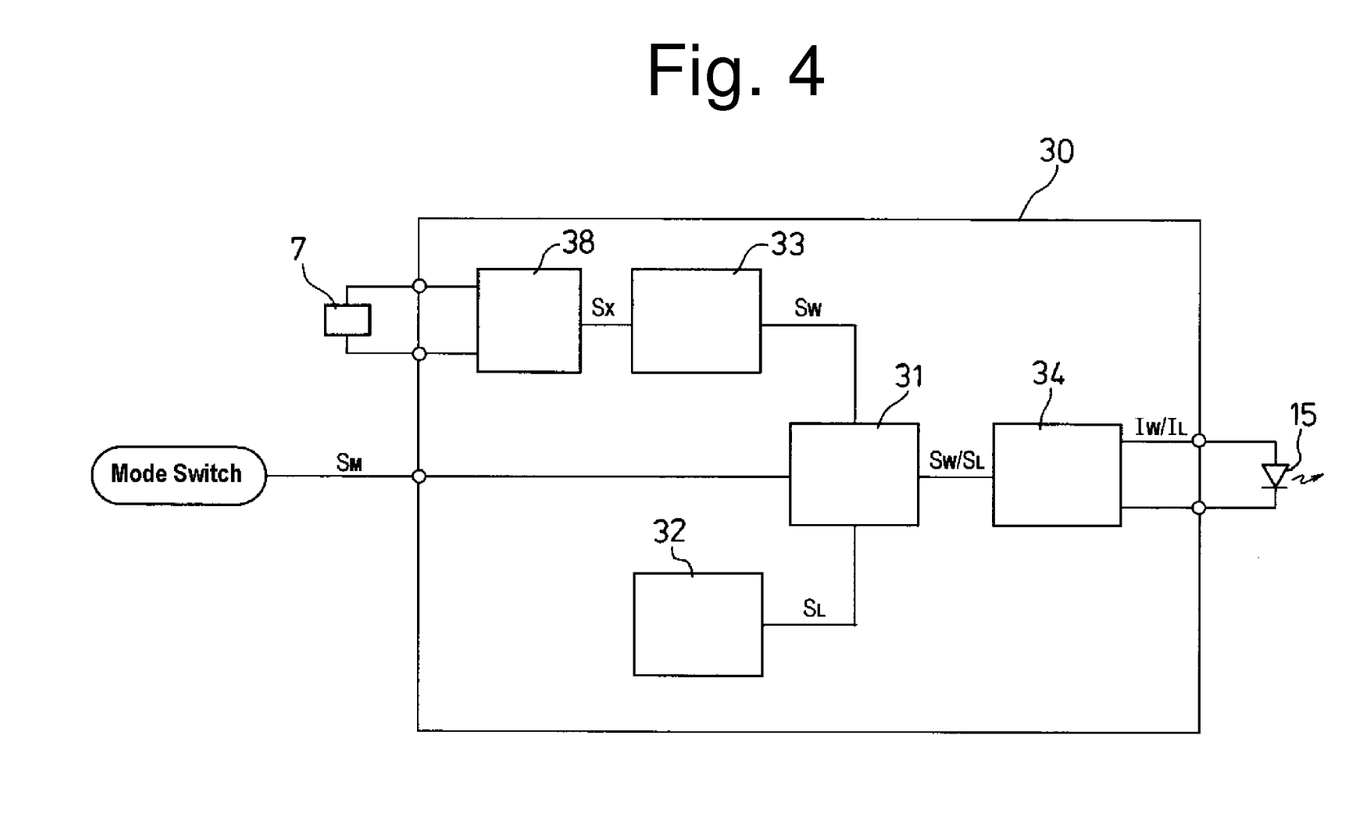
FIG. 4 is a block circuit diagram of the white LED light source module.

FIG. 4 is an exemplary block circuit diagram that can be incorporated in the white LED light source module 1 according to the present first exemplary embodiment as well as the following second exemplary embodiment. The illustrated block circuit represents a signal processing circuit 30 that can serve as an LED driving current controlling unit. The signal processing circuit 30 can include a mode switching unit 31, a light-source mode signal generating unit 32, a standby mode signal generating unit 33, an LED drive circuit unit 34, and a detector circuit unit 38. The mode switching unit 31 can switch the white LED light source module 1 between a light-source mode and a standby mode. The light-source mode signal generating unit 32 can generate and output an output signal $S_L$ based on the rated driving current $I_L$ of the blue LED element 15 so that the white LED light source 10 can emit light with a predetermined intensity in the light-source mode of the white LED light source module 1. The detector circuit unit 38 can receive an external-light detection signal from the photosensor 7 to generate and output an output signal $S_X$. In the standby mode of the white LED light source module 1, the standby mode signal generating unit 33 can generate and output an output signal $S_W$ based on the driving current $I_W$ of the blue LED element 15 so that the surface luminance of the light emitting surface of the sealing resin 20 of the white LED light source 10 is almost equal to the luminance of the received light on the light receiving surface of the photosensor 7 in response to the output signal $S_x$. The LED drive circuit unit 34 can generate and output a current $I_L$ or 4 in response to the output signal from the light-source mode signal generating unit 32 or the standby mode signal generating unit 33, so that the blue LED element 15 can be driven (turned on).

Specifically, the white LED light source module 1 in the light-source mode can be configured such that the mode switching unit 31 receives a signal $S_M$ indicative of the light-source mode from outside the circuit, and the mode switching unit 31 can select the light-source mode signal generating unit 32 to receive the output signal $S_L$ from the light-source mode signal generating unit 32 and transmit it to the LED driving circuit unit 34, whereby the LED drive circuit unit 34 can generate and output the driving current $I_L$ to the blue LED element 15.

On the other hand, the white LED light source module 1 in the standby mode can be configured such that the mode switching unit 31 receives no signal from outside the circuit, and the mode switching unit 31 can select the standby mode signal generating unit 33 to receive the output signal $S_W$ from the standby mode signal generating unit 33 and transmit it to the LED driving circuit unit 34, whereby the LED drive circuit unit 34 can generate and output the driving current $I_W$ to the blue LED element 15.

In the standby mode of the white LED light source module 1, the blue LED element 15 can be supplied with the small driving current $I_W$ corresponding to the brightness of the external light detected by the photosensor 7, so that the white LED light source can be lit with the luminance almost equal to the external light. Accordingly, when the external light varies, the white LED light source 10 can be lit with the luminance varied corresponding to the brightness of the external light.

As a result, the color intrinsic to the fluorescent material 19 in the sealing resin 20 can be concealed while the faint lighting state of the white LED light source module 1 in the standby mode can be controlled to be inconspicuous. Accordingly, this configuration can improve the appearance of apparatus, equipment, and the like that are provided with this white LED light source module 1 thereby improving the quality and the merchandizability.

It should be noted that the circuit to be incorporated in the white LED light source module 1 is not limited to the illustrated circuit so long as it can control the white LED light source module 1 in the standby mode so that the white LED light source module 1 can be lit with the luminance substantially the same as the external light by supplying the blue LED element 15 with a small driving current $I_W$ corresponding to the brightness of the external light detected by the photosensor 7.

Note that the driving current $I_W$ for the blue LED element 15 in the standby mode may be a direct current or pulse current. The pulse current can reduce power source load, and accordingly, it may be suitable for a battery driven apparatus and the like that incorporate the white LED light source module.

[Second Exemplary Embodiment]

As in the previous first exemplary embodiment, the white LED light source module can include a single white LED light source and a single photosensor. The white LED light source 10 may have light distribution characteristics with a Lambertian distribution as shown in FIG. 3, and accordingly, the intensity of light emitted from the blue LED element 15 and directed in a sideward direction of the white LED light source 10 is low. In the second exemplary embodiment, taking this into consideration, a shielding wall is omitted in contrast to the first exemplary embodiment.

Figure 5A:
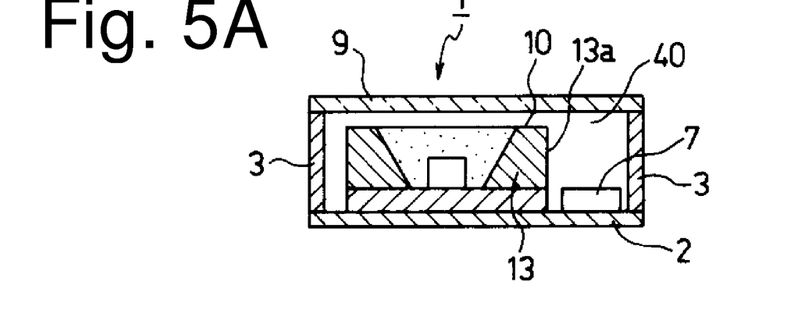
FIG. 5A is a cross sectional view illustrating a second exemplary embodiment of a white LED light source module made in accordance with principles of the presently disclosed subject matter.
Figure 5B:
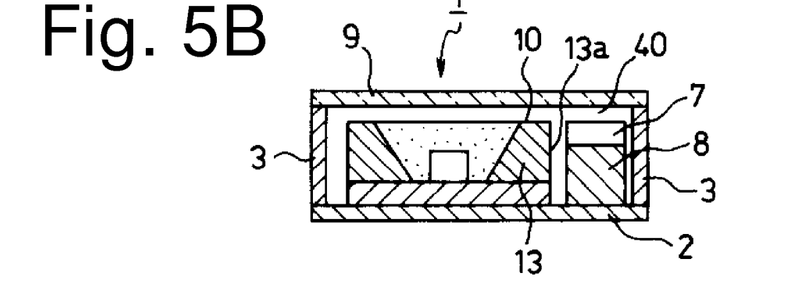
FIG. 5B is a cross sectional view illustrating one modified example of the present exemplary embodiment of the white LED light source module.
Figure 5C:
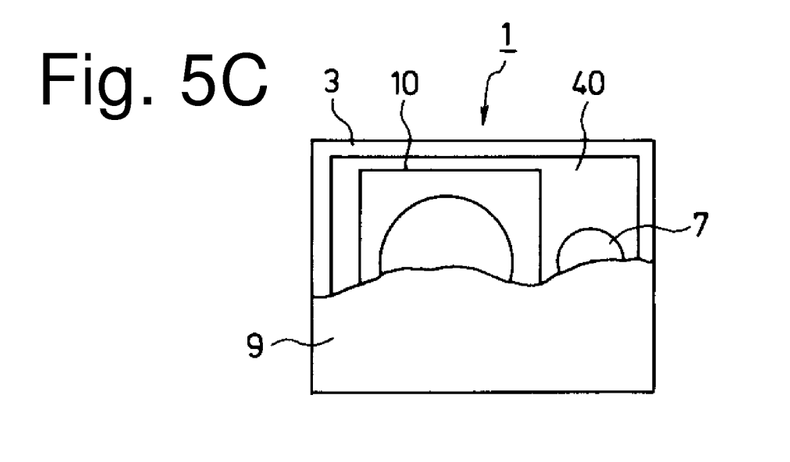
FIG. 5C is a partially cut top view of the white LED light source module of FIG. 5A or 5B.

FIG. 5A is a cross sectional view illustrating the second exemplary embodiment of the white LED light source module 1, FIG. 5B is a cross sectional view illustrating one modified example of the present exemplary embodiment of FIG. 5A, and FIG. 5C is a partially cut top view of the white LED light source module 1 of FIG. 5A or 5B.

The white LED light source module 1 as shown in FIG. 5A can include a mounting base 2 and a side wall 3 provided on and erected from the mounting base 2 with the side wall 3 being formed from a high reflectance member with a high shielding effect. The side wall 3 can define a third space 40 in which the white LED light source 10 and the photosensor 7 can be mounted on the mounting base 2 side by side as shown in FIG. 5A. In the modified example in FIG. 5B, the photosensor 7 can be mounted on a seating member 8 that is disposed on the mounting base 2 so that the white LED light source 10 can be flush with the photosensor 7 on top of the seating member 8.

Above the white LED light source 10 and the photosensor 7, a transparent cover 9 can be disposed so as to cover them.

In the white LED light source module 1 of FIG. 5A, the photosensor 7 is mounted on the mounting base 2 within an area which is defined by the side wall 3 made of a high reflectance member and the outside wall 13a of the reflecting frame 13 of the white LED light source 10 also made of a high reflectance member with a high shielding effect. Although the photosensor 7 is located away from the transparent cover 9, the external light can reach the light receiving surface of the photosensor 7 while being efficiently reflected by the surrounding side wall 3 and the outside wall 13a of the reflecting frame 13.

In the white LED light source module 1 of FIG. 5B, the seating member 8 can be disposed on the mounting base 2 within an area which is defined by the side wall 3 made of a high reflectance member and the outside wall 13a of the reflecting frame 13 of the white LED light source 10 also made of a high reflectance member with a high shielding effect, and the photosensor 7 can be mounted on the seating member 8 so that the white LED light source 10 can be flush with the photosensor 7 on top of the seating member 8. Since the photosensor 7 is located near the transparent cover 9, the external light can efficiently and directly reach the light receiving surface of the photosensor 7.

In the case of the white LED light source module 1 as shown in FIG. 5A, there is no need to provide the module with a seating member 8, thereby reducing the manufacturing costs for this member as well as man hour for assembly.

In the case of the white LED light source module 1 as shown in FIG. 5B, the external light can be directly received by the photosensor 7, thereby achieving accurate detection of external light. This means the adjustment of the brightness of the white LED light source to that of the external light can be facilitated.

Furthermore, in the second exemplary embodiment, the shielding wall 4 is omitted from the configuration of the first exemplary embodiment. Accordingly, the present exemplary embodiment can reduce the manufacturing and assembling costs for the shielding wall as well as the size of the white LED light source module 1.

The provision of the shielding wall 4 can ensure the prevention of optical noise from the adjacent white LED light source 10, and accordingly, the omission/provision of the shielding wall 4 can be determined in accordance with the balance between the manufacturing costs and the detection accuracy depending on the intended purposes and/or applications of the device.

[Third Exemplary Embodiment]

In the third exemplary embodiment, the white LED light source module can further include an additional photosensor, namely, the white LED light source module can include a single white LED light source and two photosensors.

Figure 6A:
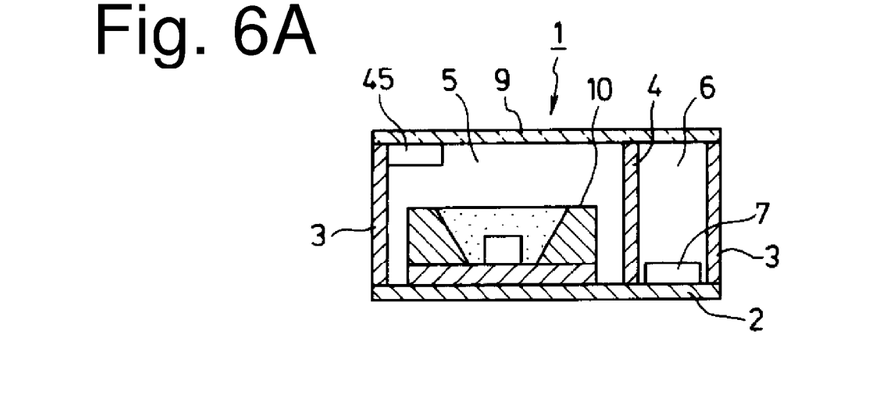
FIG. 6A is a cross sectional view illustrating a third exemplary embodiment of a white LED light source module made in accordance with principles of the presently disclosed subject matter.
Figure 6B:
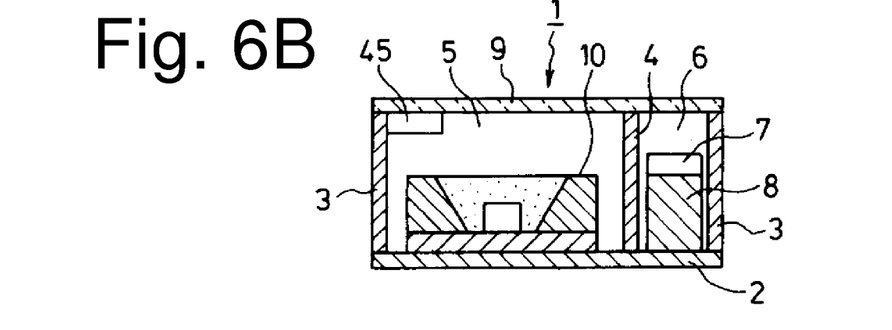
FIG. 6B is a cross sectional view illustrating one modified example of the present exemplary embodiment of the white LED light source module.
Figure 6C:
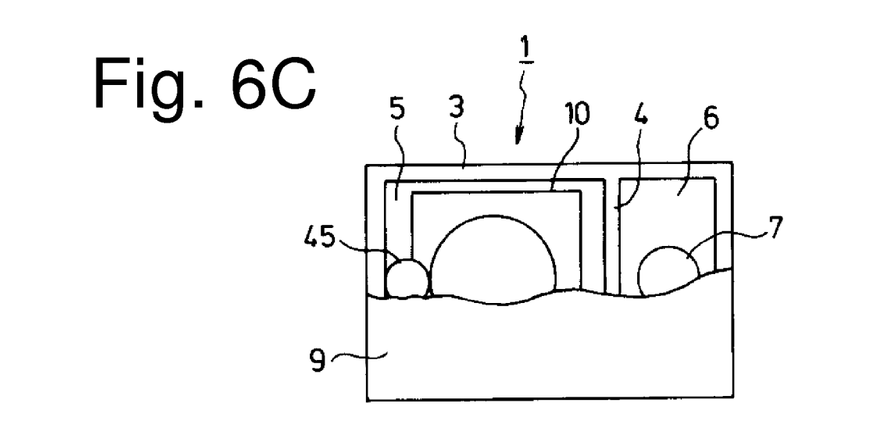
FIG. 6C is a partially cut top view of the white LED light source module of FIG. 6A or 6B.

FIG. 6A is a cross sectional view illustrating the third exemplary embodiment of the white LED light source module 1, FIG. 6B is a cross sectional view illustrating one modified example of the present exemplary embodiment, and FIG. 6C is a partially cut top view of the white LED light source module 1 of FIG. 6A or 6B.

The white LED light source module 1 of FIG. 6A (6B) can be configured such that the configuration of FIG. 1A (1B) is provided with an additional photosensor 45 on an inner surface of the transparent cover 9 above the white LED light source 10 so that the light receiving surface of the photosensor 45 faces towards the white LED light source 10.

In the present exemplary embodiment, the photosensor 45 can detect the brightness of the white LED light source 10 while the photosensor 7 can detect the brightness of the external light in the standby mode. Accordingly, the white LED light source module 1 in the standby mode can be configured such that the driving current for the blue LED element can be controlled so that the brightness of the white LED light source is always substantially the same as that of the external light (so that the intensity of the received light by the photosensor 45 is equal to that by the photosensor 7).

Figure 7:
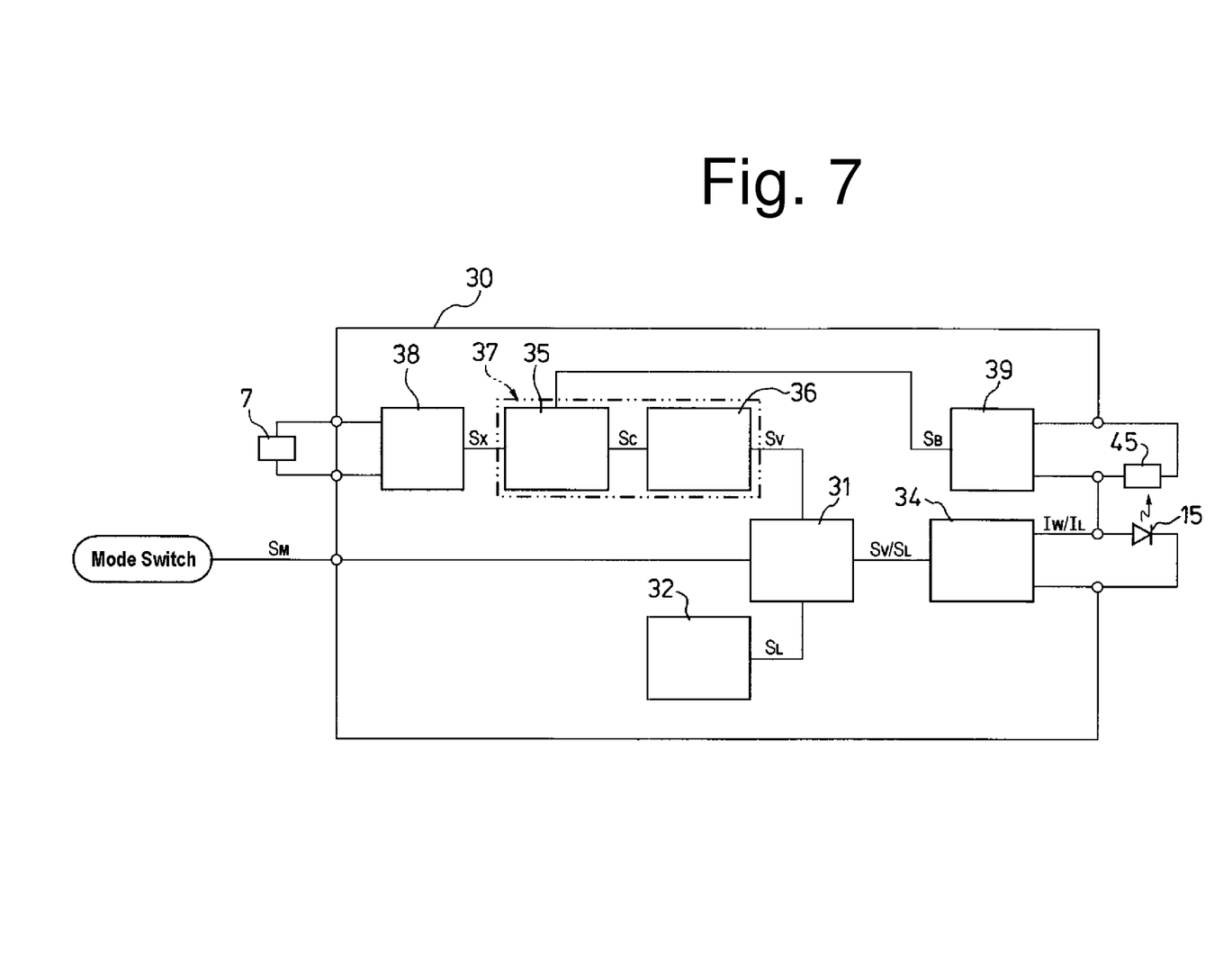
FIG. 7 is a block circuit diagram of the white LED light source module of FIG. 6A-C.

FIG. 7 is an exemplary block circuit diagram that can be incorporated in the white LED light source module 1 according to the present third exemplary embodiment as well as the following fourth exemplary embodiment.

The circuit 30 shown as a block diagram in FIG. 7 can be configured to add a feed-back circuit unit 37 instead of the standby mode signal generating unit 33 shown in the previous circuit 30 of FIG. 4, and can also include a second detection circuit unit 39 for the photosensor 45.

Specifically, the detector circuit unit 38 can receive an external-light detection signal from the photosensor 7 to generate and output an output signal $S_x$, and upon reception of the light from the white LED light source 10 by the photosensor 45 the detector circuit unit 39 can receive an illumination-light detection signal from the photosensor 45 to generate and output an output signal $S_B$. The feed-back circuit unit 37 can be configured to include a signal comparing unit 35 and an operating unit 36. The signal comparing unit 35 can be configured to compare the output signal $S_x$ and the output signal $S_B$ and output an output signal $S_C$ indicative of the comparison result. The operating unit 36 can generate and output an operation signal $S_Y$ upon reception of the output signal $S_C$ from the signal comparing unit 35 so as to control the LED driving current $I_W$.

Specifically, the white LED light source module 1 in the light-source mode can be configured such that the mode switching unit 31 receives a signal $S_M$ indicative of the light-source mode from outside the circuit, and the mode switching unit 31 can select the light-source mode signal generating unit 32 to receive the output signal $S_L$ from the light-source mode signal generating unit 32 and transmit it to the LED driving circuit unit 34, whereby the LED drive circuit unit 34 can generate and output the driving current $I_L$ to the blue LED element 15.

On the other hand, the white LED light source module 1 in the standby mode can be configured such that the mode switching unit 31 receives no signal from outside the circuit. The output signal $S_x$ from the detector circuit unit 38 that has received an external-light detection signal from the photosensor 7, and the output signal $S_B$ from the detector circuit unit 39 that has received an illumination-light detection signal from the photosensor 45 can be delivered to the signal comparing unit 35. Then, the signal comparing unit 35 can compare the output signal $S_x$ and the output signal $S_B$ and output an output signal $S_C$ indicative of the comparison result to the operating unit 36 for controlling the LED driving current $I_W$. Then, the operating unit 36 can generate and output an operation signal $S_y$ to the LED driving circuit unit 34 so as to supply the blue LED device 15 with the LED driving current $I_W$ for light emission.

Specifically, the white LED light source module 1 in the standby mode can compare the brightness of the external light detected by the photosensor 7 with the brightness of the illumination light from the white LED light source detected by the photosensor 45. Then, the white LED light source module 1 can supply the blue LED element 15 with a small driving current $I_W$ so as to reduce the difference in brightness, thereby allowing the white LED light source 10 to emit light with the brightness almost equal to the external light. Accordingly, when the external light varies, the white LED light source 10 can be lit with a luminance that varies corresponding to the brightness of the external light.

In the case of the white LED light source module 1 as shown in FIG. 6A, there is no need to provide the module with a seating member 8, thereby reducing the manufacturing costs for this member as well as man hour for assembly.

In the case of the white LED light source module 1 as shown in FIG. 6B, the external light can be directly received by the photosensor 7, thereby achieving accurate detection of external light. This means the adjustment of the brightness of the white LED light source to that of the external light can be facilitated.

[Fourth Exemplary Embodiment]

As in the previous third exemplary embodiment, the white LED light source module can include a single white LED light source and two photosensors. The white LED light source 10 may have light distribution characteristics with a Lambertian distribution as shown in FIG. 3, and accordingly, the intensity of light emitted from the blue LED element 15 and directed in a sideward direction of the white LED light source 10 is low. In the fourth exemplary embodiment, taking this into consideration, a shielding wall is omitted in contrast to the third exemplary embodiment.

Figure 8A:
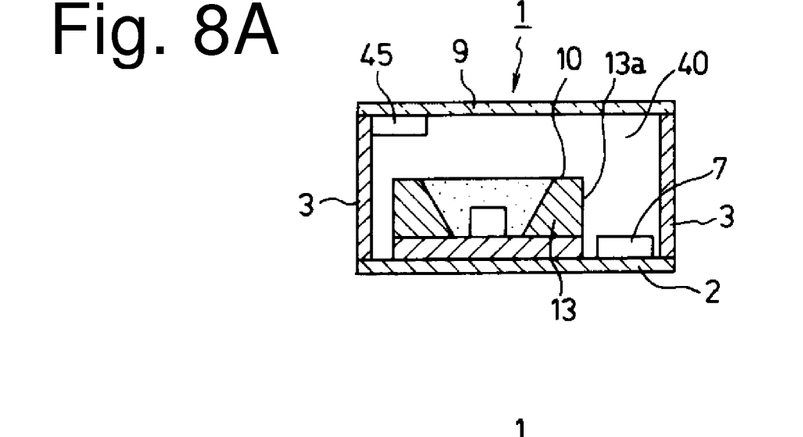
FIG. 8A is a cross sectional view illustrating a fourth exemplary embodiment of a white LED light source module made in accordance with principles of the presently disclosed subject matter.
Figure 8B:
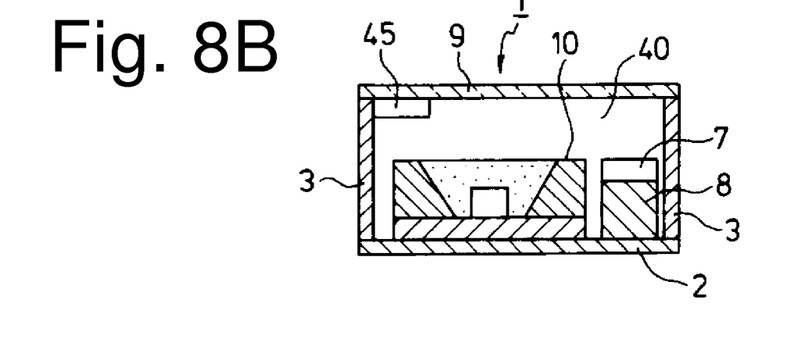
FIG. 8B is a cross sectional view illustrating one modified example of the present exemplary embodiment of the white LED light source module.
Figure 8C:
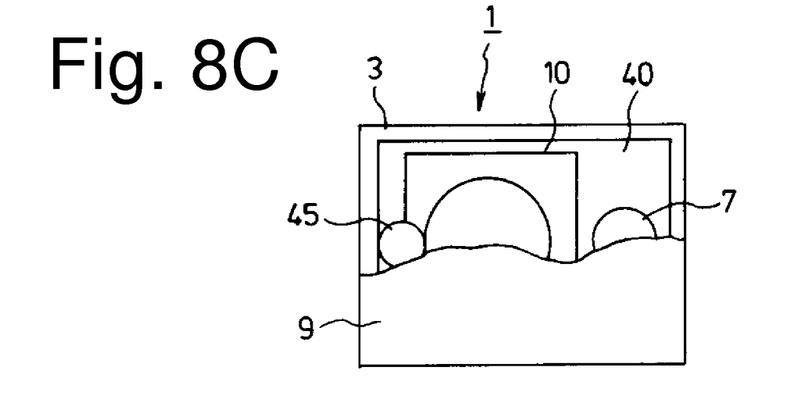
FIG. 8C is a partially cut top view of the white LED light source module of FIG. 8A or 8B.

FIG. 8A is a cross sectional view illustrating the fourth exemplary embodiment of the white LED light source module 1, FIG. 8B is a cross sectional view illustrating one modified example of the present exemplary embodiment of FIG. 8A, and FIG. 8C is a partially cut top view of the white LED light source module 1 of FIG. 8A or 8B.

The white LED light source module 1 as shown in FIG. 8A can include a mounting base 2 and a side wall 3 provided on and erected from the mounting base 2 with the side wall 3 being formed from a high reflectance member with a high shielding effect. The side wall 3 can define a third space 40 in which the white LED light source 10 and the photosensor 7 can be mounted on the mounting base 2 side by side as shown in FIG. 8A. In the modified example in FIG. 8B, the photosensor 7 can be mounted on a seating member 8 that is disposed on the mounting base 2 so that the white LED light source 10 can be flush with the photosensor 7 on top of the seating member 8. In addition, the white LED light source module 1 of FIG. 8A (8B) can be configured such that an additional photosensor 45 is provided on an inner surface of the transparent cover 9 above the white LED light source 10 so that the light receiving surface of the photosensor 45 faces towards the white LED light source 10.

In the present exemplary embodiment, the photosensor 45 can detect the brightness of the white LED light source 10 while the photosensor 7 can detect the brightness of the external light when in the standby mode. Accordingly, the white LED light source module 1 in the standby mode can be configured such that the driving current for the blue LED element can be controlled so that the brightness of the white LED light source is always substantially the same as that of the external light (so that the intensity of the received light by the photosensor 45 is equal to that received by the photosensor 7).

In the case of the white LED light source module 1 as shown in FIG. 8A, there is no need to provide the module with a seating member 8, thereby reducing the manufacturing costs for this member as well as man hour for assembly.

In the case of the white LED light source module 1 as shown in FIG. 8B, the external light can be directly received by the photosensor 7, thereby achieving accurate detection of external light. This means the adjustment of the brightness of the white LED light source to that of the external light can be facilitated.

Furthermore, in the fourth exemplary embodiment, the shielding wall 4 is omitted from the configuration of the third exemplary embodiment. Accordingly, the present exemplary embodiment can reduce the manufacturing and assembling costs for the shielding wall as well as the size of the white LED light source module 1.

The provision of the shielding wall 4 can ensure the prevention of optical noise from the adjacent white LED light source 10, and accordingly, the omission/provision of the shielding wall 4 can be determined in accordance with the balance between the manufacturing costs and the detection accuracy depending on the intended purpose and/or application of the device.

[Fifth Exemplary Embodiment]

FIG. 9A to 12B illustrate the fifth exemplary embodiment and its modified examples of a white LED light source module 1 made in accordance with principles of the presently disclosed subject matter, with the A series each illustrating a cross sectional view while the B series illustrating a partially cut top view of the white LED light source module 1.

In the present exemplary embodiment, instead of the photosensor 7 used in the previous exemplary embodiments, a transparent thin film solar panel (hereinafter, simply referred to as "solar cell") can be provided to drive the blue LED element with its electromotive force when the solar cell receives external light in the standby mode of the white LED light source module. Accordingly, when the white LED light source module does not function as a light source and is in a standby mode, the transparent thin film solar panel can receive external light to generate a driving current for the blue LED element so that the brightness of the white LED light source can be substantially the same as that of the external light.

In the present exemplary embodiment, the light receiving area of the transparent thin film solar panel can be set larger than the photosensor provided in the other exemplary embodiments, thereby achieving the greater detection sensitivity to the external light and facilitating the adjustment of the brightness of the white LED light source with respect to the external light. Furthermore, the current that can be supplied to the white LED light source can be increased, thereby increasing the adaptability of the white LED light source module with respect to the varied brightness of the external light while the more accurate adjustment of the brightness of the white LED light source to that of the external light can be achieved.

In the present exemplary embodiment, the solar cell can generate a higher current value by the external light due to the increase light receiving area than the photosensor. Accordingly, while the photosensor can only generate a weak current to serve as a signal source, the solar cell can directly drive the white LED light source.

When the external light is significantly bright, the current value required for the faint light to be generated by the white LED light source can be small. Accordingly, the excess amount of the generated current can be used to power other peripheral devices such as pulse driven circuits, the signal processing circuit 30, or other electric devices or to perform auxiliary battery charge or the like.

Figure 9A:
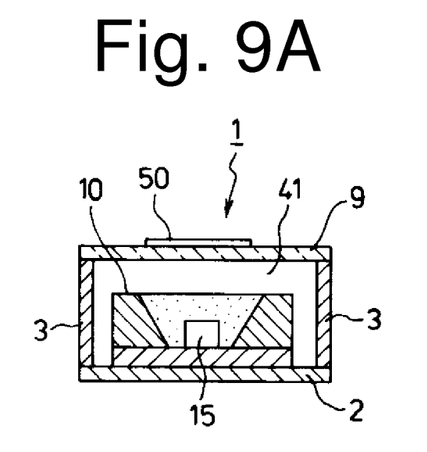
FIG. 9A is a cross sectional view illustrating a fifth exemplary embodiment of a white LED light source module made in accordance with principles of the presently disclosed subject matter.
Figure 9B:
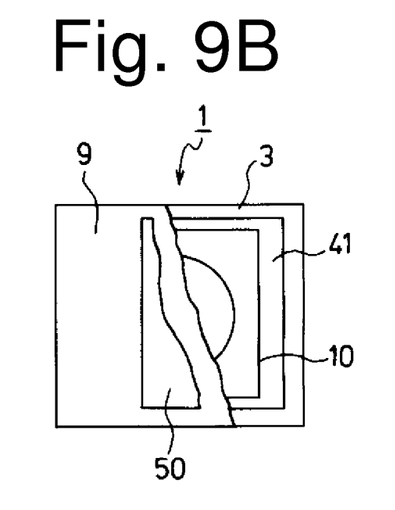
FIG. 9B is a partially cut top view of the white LED light source module of FIG. 9A.
Figure 10A:
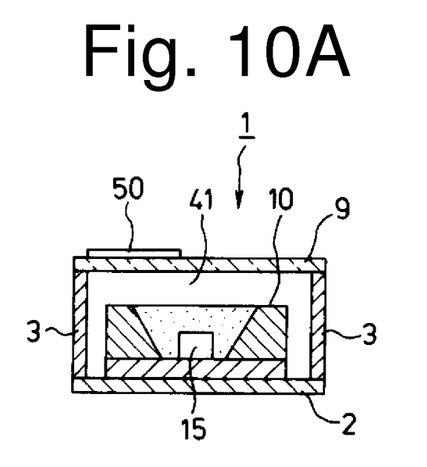
FIG. 10A is a cross sectional view illustrating a modified example of the fifth exemplary embodiment of FIG. 9A.
Figure 10B:
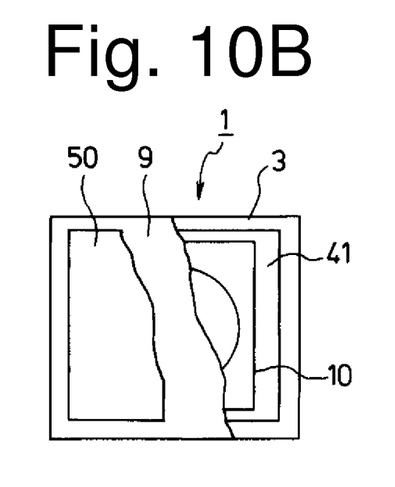
FIG. 10B is a partially cut top view of the white LED light source module of FIG. 10A.
Figure 11A:
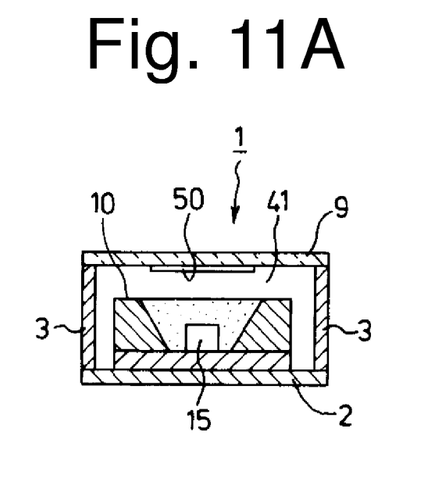
FIG. 11A is a cross sectional view illustrating another modified example of the fifth exemplary embodiment of FIG. 9A.
Figure 11B:
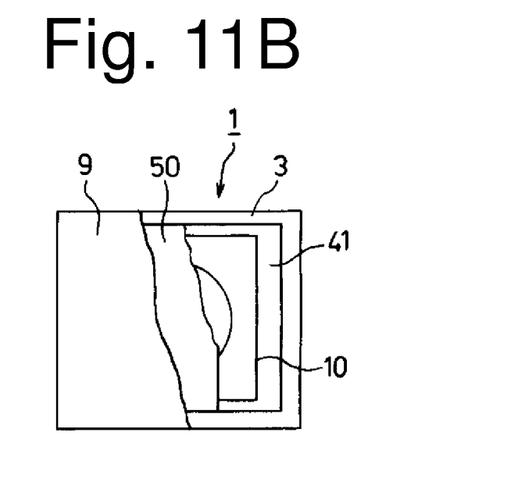
FIG. 11B is a partially cut top view of the white LED light source module of FIG. 11A.
Figure 12A:
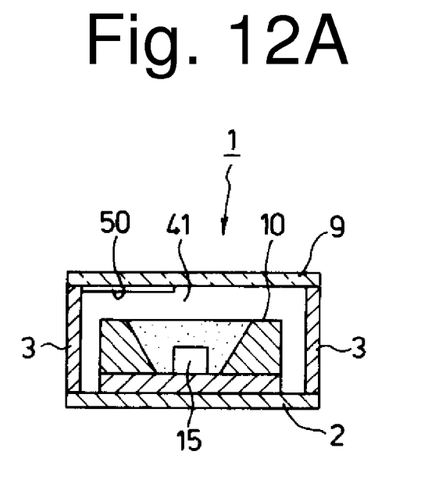
FIG. 12A is a cross sectional view illustrating still another modified example of the fifth exemplary embodiment of FIG. 9A.
Figure 12B:
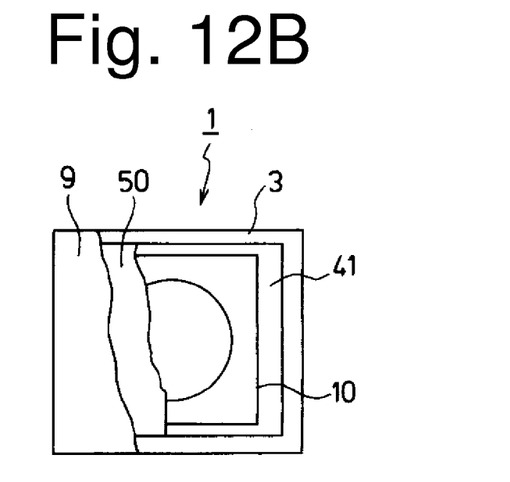
FIG. 12B is a partially cut top view of the white LED light source module of FIG. 12A.

The white LED light source module 1 of the present exemplary embodiment can be configured to include a mounting base 2 and a side wall 3 provided on and erected from the mounting base 2 with the side wall 3 being formed from a high reflectance member with a high shielding effect. The side wall 3 can define a fourth space 41 within which the white LED light source 10 can be mounted on the mounting base 2 and a transparent cover 9 can cover the white LED light source 10.

A transparent thin film solar panel 50 can be attached to the transparent cover 9. In various modified examples, the transparent thin film solar panel 50 can be attached to the center area of the outer surface of the transparent cover 9 (see FIGS. 9A and 9B), to the peripheral area of the outer surface of the transparent cover 9 (see FIGS. 10A and 10B), to the center area of the inner surface of the transparent cover 9 (see FIGS. 11A and 11B), and to the peripheral area of the inner surface of the transparent cover 9 (see FIGS. 12A and 12B).

In the modified examples in FIGS. 11A, 11B, and 12A, 12B, the solar cell 50 can be disposed inside of the fourth space 41 hermetically sealed by the mounting base 2, the side wall 3 and the transparent cover 9 to be protected from outside. Accordingly, the device reliability can be increased. Alternatively, the solar cell can be mounted away from and separate from the module 1, but for electrical communication.

In the modified examples in FIGS. 10A, 10B, and 12A, 12B, the solar cell 50 can be shifted from the position immediately above the white LED light source 10 (disposed at the peripheral area). Accordingly, the light loss from the white LED light source 10 through the center area of the transparent cover 9 can be minimized, thereby achieving a brighter white LED light source module.

It should be noted that the size (light receiving area) of the solar cell 50 can be set on the basis of the current value for driving the blue LED element 15, but is not limited to a particular size. The solar cell 50 can be divided to two or more solar cells to compensate for each other in current required for the blue LED element 15. In this case, the divided solar cells can be attached to the portion which faces towards the white LED light source 10 and to another portion(s) which does not face towards the white LED light source 10.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A white LED light source module comprising:
a white LED light source having an illumination direction, the white LED light source including an LED element configured to emit light and a sealing resin containing a transparent resin and a fluorescent material dispersed in the transparent resin, the sealing resin configured to seal the entire LED element;
a first photosensor having a light receiving direction and configured to detect brightness of external light and to generate a first detection signal;
a lighting chamber including a mounting base portion on which the white LED light source and the first photosensor are disposed, a side wall disposed on and erected from the mounting base portion and defining an upper opening, and a transparent cover covering the opening defined by the side wall, the lighting chamber being defined by the mounting base portion, the side wall, and the transparent cover, the white LED light source and the first photosensor being disposed side by side such that the illumination direction of the white LED light source is substantially the same direction as the light receiving direction of the first photosensor;
an LED driving current controlling unit configured to control an LED driving current to the LED element, wherein when the white LED light source module does not function as a light source and is in a standby state, the first photosensor is configured to detect a brightness of external light to generate and send the first detection signal to the LED driving current controlling unit, and according to the first detection signal the LED driving current controlling unit is configured to generate and send a controlled current to drive the LED element such that brightness of the white LED light source becomes substantially the same as the brightness of the external light.

2. The white LED light source module according to claim 1, further comprising:
a second photosensor that is disposed adjacent the transparent cover and includes a light receiving surface facing towards the white LED light source to detect brightness of the white LED light source and to generate a second detection signal; and
a signal comparing unit configured to compare the first detection signal from the first photosensor that detects the brightness of external light with the second detection signal from the second photosensor that detects the brightness of the white LED light source to send a comparison result to the LED driving current controlling unit, and wherein
the LED driving current controlling unit is configured to control the controlled current for driving the LED element so that the brightness of the white LED light source is substantially equal to the brightness of the external light.

3. The white LED light source module according to claim 1, wherein the first photosensor includes a photodiode.

4. The white LED light source module according to claim 2, wherein the first photosensor and the second photosensor each include a photodiode.

5. The white LED light source module according to claim 1, further comprising a shielding wall disposed on the mounting base portion and having a reflecting surface on an outer surface, and wherein the transparent cover covers an end of the shielding wall and the shielding wall and the side wall define spaces accommodating the first photosensor and the white LED light source, respectively.

6. The white LED light source module according to claim 2, further comprising a shielding wall disposed on the mounting base portion and having a reflecting surface on an outer surface, and wherein the transparent cover covers an end of the shielding wall and the shielding wall and the side wall define spaces accommodating the first photosensor and the white LED light source, respectively.

7. The white LED light source module according to claim 3, further comprising a shielding wall disposed on the mounting base portion and having a reflecting surface on an outer surface, and wherein the transparent cover covers an end of the shielding wall and the shielding wall and the side wall define spaces accommodating the first photosensor and the white LED light source, respectively.

8. The white LED light source module according to claim 4, further comprising a shielding wall disposed on the mounting base portion and having a reflecting surface on an outer surface, and wherein the transparent cover covers an end of the shielding wall and the shielding wall and the side wall define spaces accommodating the first photosensor and the white LED light source, respectively.

9. The white LED light source module according to claim 1, further comprising a seating member disposed on the mounting base portion and configured to receive the first photosensor thereon so that a light emission surface of the white LED light source is flush with the first photosensor on top of the seating member.

10. The white LED light source module according to claim 2, further comprising a seating member disposed on the mounting base portion and configured to receive the first photosensor thereon so that a light emission surface of the white LED light source is flush with the first photosensor on top of the seating member.

11. The white LED light source module according to claim 3, further comprising a seating member disposed on the mounting base portion and configured to receive the first photosensor thereon so that a light emission surface of the white LED light source is flush with the first photosensor on top of the seating member.

12. The white LED light source module according to claim 4, further comprising a seating member disposed on the mounting base portion and configured to receive the first photosensor thereon so that a light emission surface of the white LED light source is flush with the first photosensor on top of the seating member.

13. The white LED light source module according to claim 5, further comprising a seating member disposed on the mounting base portion and configured to receive the first photosensor thereon so that a light emission surface of the white LED light source is flush with the first photosensor on top of the seating member.

14. The white LED light source module according to claim 6, further comprising a seating member disposed on the mounting base portion and configured to receive the first photosensor thereon so that a light emission surface of the white LED light source is flush with the first photosensor on top of the seating member.

15. The white LED light source module according to claim 7, further comprising a seating member disposed on the mounting base portion and configured to receive the first photosensor thereon so that a light emission surface of the white LED light source is flush with the first photosensor on top of the seating member.

16. The white LED light source module according to claim 8, further comprising a seating member disposed on the mounting base portion and configured to receive the first photosensor thereon so that a light emission surface of the white LED light source is flush with the first photosensor on top of the seating member.

17. A white LED light source module comprising:
- a white LED light source including an LED element configured to emit light and a sealing resin containing a transparent resin and a fluorescent material dispersed in the transparent resin, the sealing resin configured to seal the entire LED element;
- a transparent thin film solar panel; and
- a lighting chamber including a mounting base portion on which the white LED light source is disposed, a side wall disposed on and erected from the mounting base portion and defining an upper opening, and a transparent cover covering the opening defined by the side wall, the lighting chamber being defined by the mounting base portion, the side wall, and the transparent cover, wherein the transparent thin film solar panel is disposed adjacent the transparent cover, and wherein
- when the white LED light source module does not function as a light source and is in a standby state, the transparent thin film solar panel receives external light and generates a driving current for the LED element so that brightness of the white LED light source becomes substantially the same as brightness of the external light.

18. The white LED light source module according to claim 1, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

19. The white LED light source module according to claim 2, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

20. The white LED light source module according to claim 3, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

21. The white LED light source module according to claim 4, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

22. The white LED light source module according to claim 5, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

23. The white LED light source module according to claim 9, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

24. The white LED light source module according to claim 17, wherein the LED element is a blue LED element that can emit blue light, and the fluorescent material is any one of a yellow fluorescent material that when excited by blue light emits yellow light and a fluorescent material mixture of a green fluorescent material that when excited by blue light emits green light and a red fluorescent material that when excited by blue light emits red light.

\* \* \* \* \*